(12) United States Patent
Fujino et al.

(10) Patent No.: US 10,720,264 B2
(45) Date of Patent: Jul. 21, 2020

(54) LIGHT TRANSMITTING CONDUCTIVE FILM AND LIGHT CONTROL FILM

(71) Applicant: NITTO DENKO CORPORATION, Ibaraki-shi, Osaka (JP)

(72) Inventors: Nozomi Fujino, Osaka (JP); Tomotake Nashiki, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 127 days.

(21) Appl. No.: 15/772,629

(22) PCT Filed: Nov. 8, 2016

(86) PCT No.: PCT/JP2016/083033
§ 371 (c)(1),
(2) Date: May 1, 2018

(87) PCT Pub. No.: WO2017/082229
PCT Pub. Date: May 18, 2017

(65) Prior Publication Data
US 2019/0122784 A1    Apr. 25, 2019

(30) Foreign Application Priority Data

Nov. 9, 2015 (JP) .................. 2015-219593
Nov. 7, 2016 (JP) .................. 2016-217529

(51) Int. Cl.
*B32B 15/04* (2006.01)
*B32B 17/06* (2006.01)
(Continued)

(52) U.S. Cl.
CPC .............. *H01B 5/14* (2013.01); *B32B 7/00* (2013.01); *B32B 7/02* (2013.01); *B32B 7/023* (2019.01);
(Continued)

(58) Field of Classification Search
None
See application file for complete search history.

(56) References Cited

U.S. PATENT DOCUMENTS 6,351,068 B2    2/2002    Yamazaki et al.
8,059,331 B2 *  11/2011   Higashida ............... G02F 1/172
                                                 359/245
(Continued)

FOREIGN PATENT DOCUMENTS

CN    102666910 A    9/2012
CN    103999166 A    8/2014
(Continued)

OTHER PUBLICATIONS

WO2017057556 English machine translation.*
(Continued)

*Primary Examiner* — Lauren R Colgan
(74) *Attorney, Agent, or Firm* — Westerman, Hattori, Daniels & Adrian, LLP

(57) ABSTRACT

The light transmitting conductive film includes a light transmitting substrate and a non-crystal light transmitting conductive layer, wherein the conditions (1) to (3) below are satisfied when the non-crystal light transmitting conductive layer has a carrier density of $Xa \times 10^{19}(/cm^3)$ and a hole mobility of Ya $(cm^2/V \cdot s)$; a heated light transmitting conductive layer has a carrier density of $Xc \times 10^{19}(/cm^3)$ and a hole mobility of Yc $(cm^2/V \cdot s)$, wherein the heated light transmitting conductive layer is the non-crystal light transmitting conductive layer after going through heating; and a moving distance L is $\{(Xc-Xa)^2+(Yc-Ya)^2\}^{1/2}$:
(1) $Xa \leq Xc$
(2) $Ya \geq Yc$, and
(3) the moving distance L is 1.0 or more and 45.0 or less.

4 Claims, 2 Drawing Sheets

US 10,720,264 B2
Page 2

(51) Int. Cl.
| | | |
|---|---|---|
| *H01B 5/14* | (2006.01) | |
| *B32B 7/02* | (2019.01) | |
| *H01B 13/00* | (2006.01) | |
| *H01B 1/02* | (2006.01) | |
| *B32B 7/00* | (2019.01) | |
| *B32B 7/025* | (2019.01) | |
| *B32B 7/023* | (2019.01) | |
| *C23C 14/08* | (2006.01) | |
| *H01B 1/08* | (2006.01) | |
| *B29D 11/00* | (2006.01) | |
| *G02F 1/1343* | (2006.01) | |

(52) U.S. Cl.
CPC ............ *B32B 7/025* (2019.01); *C23C 14/086* (2013.01); *H01B 1/02* (2013.01); *H01B 1/08* (2013.01); *H01B 13/0026* (2013.01); *B29D 11/0073* (2013.01); *G02F 1/13439* (2013.01)

(56) References Cited

U.S. PATENT DOCUMENTS

| | | | |
|---|---|---|---|
| 9,657,386 B2 * | 5/2017 | Hayakawa | G06F 3/041 |
| 2001/0019244 A1 * | 9/2001 | Yamazaki | H05B 33/28 313/506 |
| 2003/0194551 A1 | 10/2003 | Sasa et al. | |
| 2005/0045471 A1 * | 3/2005 | Noguchi | C23C 14/0042 204/192.26 |
| 2006/0292381 A1 * | 12/2006 | Kriltz | C03C 17/366 428/432 |
| 2008/0258610 A1 * | 10/2008 | Ikeda | C09K 11/06 313/504 |
| 2010/0014150 A1 | 1/2010 | Higashida et al. | |
| 2010/0075176 A1 | 3/2010 | Yamada et al. | |
| 2010/0276688 A1 | 11/2010 | Yano et al. | |
| 2011/0129658 A1 | 6/2011 | Hu et al. | |
| 2011/0291145 A1 | 12/2011 | Han et al. | |
| 2012/0093712 A1 | 4/2012 | Yano et al. | |
| 2013/0095292 A1 * | 4/2013 | Pfaff | C03C 17/3417 428/142 |
| 2013/0140175 A1 | 6/2013 | Yano et al. | |
| 2013/0288047 A1 | 10/2013 | Kajihara et al. | |
| 2013/0313548 A1 | 11/2013 | Yano et al. | |
| 2015/0086789 A1 | 3/2015 | Kajihara et al. | |
| 2015/0145816 A1 | 5/2015 | Ueda et al. | |
| 2016/0024644 A1 | 1/2016 | Sasa et al. | |
| 2016/0155531 A1 | 6/2016 | Kawakami et al. | |

FOREIGN PATENT DOCUMENTS

| | | |
|---|---|---|
| EP | 2514851 A1 | 10/2012 |
| JP | 9-286070 A | 11/1997 |
| JP | H10-334744 A | 12/1998 |
| JP | 2003-297150 A | 10/2003 |
| JP | 2007-31178 A | 2/2007 |
| JP | 2011-106002 A | 6/2011 |
| JP | 2012-17258 A | 1/2012 |
| JP | 2012-134085 A | 7/2012 |
| JP | 2012-230491 A | 11/2012 |
| JP | 2013-152827 A | 8/2013 |
| JP | 2014-30040 A | 2/2014 |
| JP | 2014-65303 A | 4/2014 |
| JP | 2015-63743 A | 4/2015 |
| JP | 2015-104904 A | 6/2015 |
| JP | 2015-195414 A | 11/2015 |
| JP | 2016-157021 A | 9/2016 |
| TW | 391150 B | 5/2000 |
| TW | 201233827 A | 8/2012 |
| TW | 201405579 A | 2/2014 |
| WO | 2008/075773 A1 | 6/2008 |
| WO | 2008/114620 A1 | 9/2008 |
| WO | 2008/146693 A1 | 12/2008 |
| WO | 2010/058533 A1 | 5/2010 |
| WO | 2013/172055 A1 | 11/2013 |
| WO | 2014/112536 A1 | 7/2014 |
| WO | 2015/166723 A1 | 11/2015 |
| WO | 2017/057556 A1 | 4/2017 |

OTHER PUBLICATIONS

Extended (supplementary) European Search Report dated Apr. 2, 2019, issued in counterpart EP Application No. 16864190.0. (9 pages).
Notification notifying a submission of an Information Statement dated May 15, 2018, issued in counterpart Japanese Application No. 2016-217529, with English translation. (2 pages).
Request for inspection for the Information Statement dated May 15, 2018, issued in counterpart Japanese Application No. 2016-217529, with English translation. (2 pages).
Information Statement dated May May 15, 2018, issued in counterpart Japanese Application No. 2016-217529, with English translation. (22 pages).
Office Action dated Sep. 10, 2019, issued in counterpart JP Application No. 2018-000834, with English translation. (8 pages).
Notification Concerning Transmittal of Copy of International Preliminary Report on Patentability (Form PCT/IB/326) issued in counterpart International Application No. PCT/JP2016/083033 dated May 24, 2018 with forms PCT/IB/373, PCT/IB/338 and PCT/ISA/237 with translation. (11 pages).
Notification of Reasons for Refusal dated Mar. 12, 2019, issued in counterpart JP Application No. 2018-000834, with English translation. (7 pages).
International Search Report dated Jan. 31, 2017, issued in counterpart International Application No. PCT/JP2016/083033 (2 pages).
The Explanation of Circumstances Concering Accelerated Examination dated Jun. 7, 2017, issued in counterpart Japanese Patent Application No. 2016-217529, with English Translation (3 pages).
Notification of Reasons for Refusal dated Aug. 8, 2017, issued in counterpart Japanese Patent Application No. 2016-217529, with English Translation (6 pages).
Notification of Reasons for Refusal dated Nov. 14, 2017, issued in counterpart Japanese Patent Application No. 2016-217529, with English Translation (5 pages).
Notification of Reasons for Refusal dated Feb. 6, 2017, issued in counterpart Japanese Patent Application No. 2016-217529, with English Translation (6 pages).
Information Statement dated Aug. 7, 2017, issued in counterpart Japanese Patent Application No. 2016-217529, with English Translation (13 pages).
Information Statement dated Nov. 9, 2017, issued in counterpart of Japanese Patent Application No. 2016-217529 with English Translation (18 pages).
Information Statement dated Jan. 17, 2018, issued in counterpart Japanese Patent Application No. 2016-217529, with English Translation (35 pages).
Notification notifying a submission of an Information Statement dated Jul. 24, 2018, counterpart to Japanese Application No. 2018-000834, with English translation. (2 pages).
Request for Inspection for the Information Statement dated Jul. 26, 2018, issued in counterpart Japanese Application No. 2018-000834, with English translation. (2 pages).
Information Statement dated Jul. 19, 2018, issued in counterpart Japanese Application No. 2018-000834, with English translation. (22 pages).
Notification of Reasons for Refusal dated May 29, 2018, issued in counterpart Japanese Application No. 2016-217529, with English translation. (9 pages).
Office Action dated May 8, 2020, issued in counterpart TW application No. 105136518, with English translation (9 pages).

* cited by examiner

LIGHT TRANSMITTING CONDUCTIVE FILM AND LIGHT CONTROL FILM

TECHNICAL FIELD

The present invention relates to a light transmitting conductive film, and a light control film in which the light transmitting conductive film is used.

BACKGROUND ART

Recently, demand for a light control element represented by a smart window is increasing based on, for example, reduction in air conditioning burden and designability. The light control elements have been used for various usage, for example, window glass for buildings and vehicles, partition walls, and interior products.

For example. Patent Document 1 has proposed, for a light control element, a light control film including two transparent conductive resin substrates and a light control layer sandwiched by the two transparent conductive resin substrates, wherein the light control layer includes a resin matrix and a light control suspension, and the transparent conductive resin substrate has a thickness of 20 to 80 µm (for example, see Patent Document 1).

The light control film of Patent Document 1 allows for light control by controlling absorption and scattering of light that passes the light control layer by application of electric field. For such a transparent conductive resin substrate of the light control film, a film in which a transparent electrode composed of indium-tin composite oxide (ITO) is laminated on a support substrate such as polyester film is used.

CITATION LIST

Patent Document

Patent Document 1: WO2008/075773

SUMMARY OF THE INVENTION

Problem to be Solved by the Invention

Meanwhile, a conductive metal oxide layer used for transparent electrodes such as ITO layers has a crystal or non-crystal (amorphous) structure depending on its formation processes. For example, when the conductive metal oxide layer is formed on a support substrate by sputtering, a non-crystal conductive metal oxide layer is formed. The non-crystal conductive metal oxide can be converted to a crystal structure by heat.

Generally, for the transparent electrode, a crystalline conductive metal oxide layer having a low surface resistance value is used.

However, the crystalline conductive metal oxide layer has disadvantages such as poor anti-cracking and abrasion resistance. Particularly, light control films have often been used as a film having a large area due to its application, and therefore there are high possibilities that cracks and damages are caused in the processes of its molding, working, or transportation. Therefore, for the light control film, demand for non-crystal conductive metal oxide layers has been high.

However, use of such non-crystal conductive metal oxide for transparent electrodes of light control films involves exposure to open air or sunlight, and therefore heat causes partial or entire conversion to crystalline conductive metal oxide naturally, which changes its surface resistance. As a result, non-homogeneous surface resistance is caused in the light control film surfaces, which may cause inconsistent light control.

An object of the present invention is to provide a light transmitting conductive film and light control film with excellent anti-cracking properties and thermal stability.

Means for Solving the Problem

The present invention [1] includes a light transmitting conductive film including a light transmitting substrate and a non-crystal light transmitting conductive layer, wherein the conditions (1) to (3) below are satisfied when the non-crystal light transmitting conductive layer has a carrier density of $Xa \times 10^{19}(/cm^3)$ and a hole mobility of $Ya$ ($cm^2/V \cdot s$); a heated light transmitting conductive layer has a carrier density of $Xc \times 10^{19}(/cm^3)$ and a hole mobility of $Yc$ ($cm^2/V \cdot s$), wherein the heated light transmitting conductive layer is the non-crystal light transmitting conductive layer after going through heating; and a moving distance L of $\{(Xc-Xa)^2+(Yc-Ya)^2\}^{1/2}$:

(1) $Xa \leq Xc$
(2) $Ya \geq Yc$, and
(3) the moving distance L is 1.0 or more and 45.0 or less.

The present invention [2] includes the light transmitting conductive film of [1], wherein the ratio of Xc to Xa (Xc/Xa) is 1.05 or more and 1.80 or less.

The present invention [3] includes the light transmitting conductive film of [1] or [2], wherein the heated light transmitting conductive layer is non-crystal.

The present invention [4] includes the light transmitting conductive film of any one of [1] to [3], wherein the non-crystal light transmitting conductive layer contains indium-based conductive oxide.

The present invention [5] includes a light control film including a first light transmitting conductive film, a light control function layer, and a second light transmitting conductive film in sequence, wherein the first light transmitting conductive film and/or the second light transmitting conductive film include the light transmitting conductive film of any one of [1] to [4].

Effects of the Invention

The light transmitting conductive film of the present invention includes a light transmitting substrate and a non-crystal light transmitting conductive layer, and therefore has excellent anti-cracking properties. Furthermore, the non-crystal light transmitting conductive layer satisfies predetermined conditions, and therefore changes in resistivity of the light transmitting conductive layer due to heat can be suppressed, and therefore has excellent thermal stability.

The light control film of the present invention has excellent anti-cracking properties, and therefore has excellent workability and transportability. It also has excellent thermal stability, and therefore inconsistency in light control can be reduced for a long period of time.

DESCRIPTION OF THE EMBODIMENTS

Figure 1:
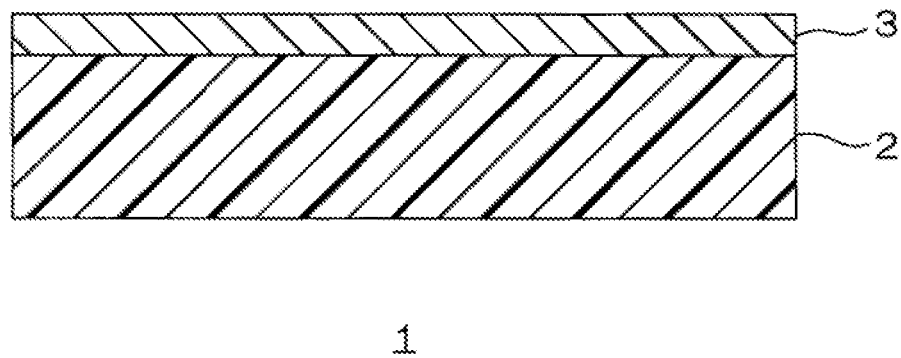
FIG. 1 shows a cross-sectional view of an embodiment of the light transmitting conductive film of the present invention.

In FIG. 1, the up-down direction on the plane of the sheet is up-down direction (thickness direction, first direction), the upper side on the plane of the sheet is upper side (one side in thickness direction, one side in first direction), and the lower side on the plane of the sheet is lower side (the other side in thickness direction, the other side in first direction). In FIG. 1, the left-right direction on the plane of the sheet is left-right direction (width direction, second direction orthogonal to first direction), left side on the plane of the sheet is left side (one side in second direction), and right side on the plane of the sheet is right side (the other side in second direction). In FIG. 1, paper thickness direction is front-rear direction (third direction orthogonal to first direction and second direction), near side on the plane of the sheet is the front side (one side in third direction), and far side on the plane of the sheet is rear side (the other side in third direction). To be specific, the directions are in accordance with the direction arrows in the figures.

1. Light Transmitting Conductive Film

Figure 2:
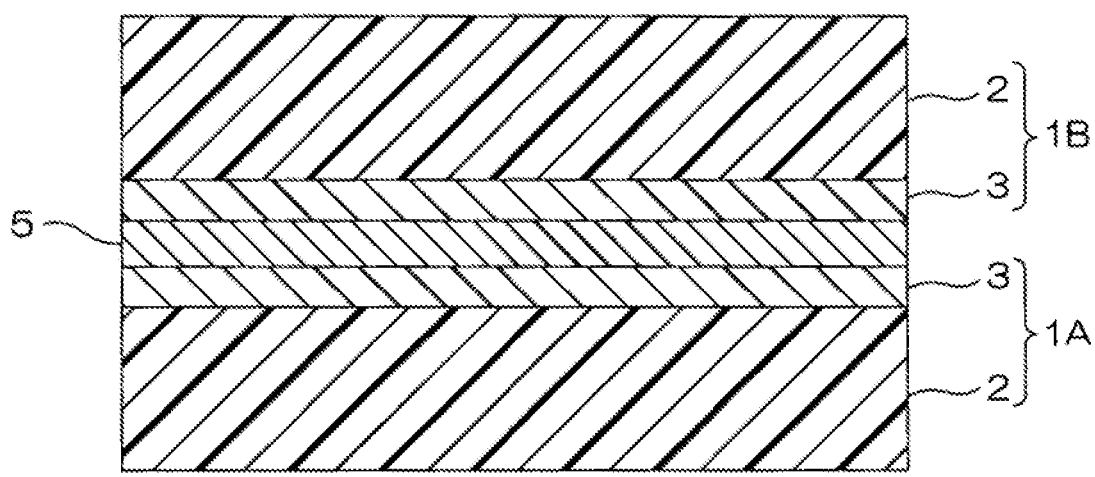
FIG. 2 shows a cross-sectional view of a light control film including the light transmitting conductive film shown in FIG. 1.

In an embodiment of the light transmitting conductive film 1, as shown in FIG. 1, the light transmitting conductive film 1 has a film shape with a predetermined thickness (including sheet shape), extends in a predetermined direction orthogonal to thickness direction (front-rear direction and left-right direction, that is, surface direction), and has a flat upper face and a flat lower face (two main faces). The light transmitting conductive film 1 is one component of for example, a light control film 4 (described later, ref: FIG. 2). That is, it is not a light control device (described later). That is, the light transmitting conductive film 1 is a component for producing, for example, a light control film 4; does not include, for example, a light control function layer 5; is distributed as a single component; and is an industrially applicable device.

To be specific, the light transmitting conductive film 1 includes a light transmitting substrate 2 and a non-crystal light transmitting conductive layer 3 in sequence. That is, the light transmitting conductive film 1 includes the light transmitting substrate 2 and the non-crystal light transmitting conductive layer 3 disposed on the upper side of the light transmitting substrate 2. Preferably, the light transmitting conductive film 1 is composed only of the light transmitting substrate 2 and the non-crystal light transmitting conductive layer 3. Each of the layers is described below.

2. Light Transmitting Substrate

The light transmitting substrate 2 is the lowermost layer of the light transmitting conductive film 1, and is a support for securing mechanical strength of the light transmitting conductive film 1.

The light transmitting substrate 2 has a film shape (including sheet shape).

The light transmitting substrate 2 is composed of, for example, an organic film, and an inorganic plate such as glass plate. The light transmitting substrate 2 is preferably composed of an organic film, more preferably a polymer film. The organic film contains water or organic gas, and therefore suppresses crystallization based on heating of the non-crystal light transmitting conductive layer 3, and can keep non-crystallinity even more.

The polymer film has light transmission properties. Examples of materials for the polymer film include polyester resin such as polyethylene terephthalate (PET), polybutylene terephthalate, and polyethylenenaphthalate; (meth) acrylic resin (acrylic resin and/or methacryl resin) such as polymethacrylate; olefin resin such as polyethylene, polypropylene, and cycloolefin polymer; polycarbonate resin; polyether sulfone resin; polyarylate resin; melamine resin; polyamide resin; polyimide resin, cellulose resin, polystyrene resin, and norbornene resin. These polymer films may be used singly, or may be used in a combination of two or more. In view of light transmission properties, heat resistance, and mechanical properties, preferably, polyester resin is used, more preferably, PET is used.

The light transmitting substrate 2 has a thickness of, for example, 2 μm or more, preferably 20 μm or more, more preferably 40 μm or more, and for example, 300 μm or less, preferably 200 μm or less.

The thickness of the light transmitting substrate 2 can be measured by using, for example, a coating thickness meter.

A separator can be included at the lower face of the light transmitting substrate 2.

3. Non-Crystal Light Transmitting Conductive Layer

The non-crystal light transmitting conductive layer 3 is a non-crystal light transmitting conductive layer, and is a conductive layer that can be patterned by etching in later steps.

The non-crystal light transmitting conductive layer 3 has a film shape (including sheet shape), and is disposed on the entire upper face of the light transmitting substrate 2 so as to contact the upper face of the light transmitting substrate 2.

Examples of materials for the non-crystal light transmitting conductive layer 3 include metal oxide including at least one metal selected from the group consisting of In, Sn, Zn, Ga, Sb, Ti, Si, Zr, Mg, Al, Au, Ag, Cu, Pd, and W. Metal oxide can be further doped with the metal atoms shown in the group above, as necessary.

Examples of the non-crystal light transmitting conductive layer 3 include indium-based conductive oxide such as indium-tin composite oxide (ITO), and antimony-based conductive oxide such as antimony-tin composite oxide (ATO). In view of decreasing surface resistance and ensuring excellent light transmission properties, the non-crystal light transmitting conductive layer 3 contains indium-based conductive oxide, and more preferably, contains indium-tin composite oxide (ITO). That is, the non-crystal light transmitting conductive layer 3 is preferably an indium-based conductive oxide layer, more preferably, ITO layer. In this manner, low resistance and excellent light transmission properties can be achieved.

When ITO is used as the material for the non-crystal light transmitting conductive layer 3, the tin oxide ($SnO_2$) content relative to a total amount of tin oxide and indium oxide ($In_2O_3$) is, 0.5 mass % or more, preferably 3 mass % or more, more preferably 8 mass % or more, and for example, 25 mass % or less, preferably 15 mass % or less, more preferably 13 mass % or less. Tin oxide content of the above-described lower limit or more allows for achievement of a low surface resistance value (for example, 150Ω/□ or less) of the non-crystal light transmitting conductive layer 3, while achieving more reliable suppression of conversion to crystal. The tin oxide content of the above-described upper limit or less allows for improvement in light transmission properties and stability of surface resistance.

"ITO" in this specification is those composite oxides including at least indium (In) and tin (Sn), and may include additional components other than those, Examples of the additional component include metal elements other than In and Sn, to be specific, Zn, Ga, Sb, Ti, Si, Zr, Mg, Al, Au, Ag, Cu, Pd, W, Fe, Pb, Ni, Nb, Cr, and Ga.

The non-crystal light transmitting conductive layer 3 is a non-crystal (amorphous) light transmitting conductive layer, and preferably a non-crystal ITO layer. In this manner, excellent anti-cracking properties and abrasion resistance are achieved.

Non-crystallinity of the non-crystal light transmitting conductive layer 3 can be determined by, for example, when the non-crystal light transmitting conductive layer 3 is an ITO layer, immersing it in hydrochloric acid (concentration 5 mass %) of 20° C. for 15 minutes, washing with water and drying, and then measuring the resistance between terminals of about 15 mm. In this specification, the light transmitting conductive layer is determined as non-crystal when the resistance between the terminals of 15 mm in the light transmitting conductive layer is 10 kΩ or more after the light transmitting conductive film 1 is immersed in hydrochloric acid (20° C., concentration: 5 mass %), washed with water, and dried.

The non-crystal light transmitting conductive layer 3 preferably contains impurity elements. Examples of the impurity elements include elements (for example, Ar element) derived from sputtering gas used when forming the non-crystal light transmitting conductive layer 3, and elements (for example, H element, C element) derived from water and organic gas contained in the light transmitting substrate 2. By containing these, non-crystallinity of the non-crystal light transmitting conductive layer 3 can be improved even more.

To be specific, the Ar element content in the non-crystal light transmitting conductive layer 3 is, for example, 0.2 atomic % or more, preferably 0.3 atomic % or more, and for example, 0.5 atomic % or less, preferably 0.4 atomic % or less. With the Ar element amount of the above-described lower limit or more, non-crystallinity of the non-crystal light transmitting conductive layer 3 can be kept even more easily. Meanwhile, the Ar element amount of the upper limit or less stabilizes the rate of change in resistance of the non-crystal light transmitting conductive layer 3 even more. The impurity element content such as Ar element content can be suitably adjusted by adjusting the sputtering conditions, for example, sputtering power source, magnetic field strength, and atmospheric pressure.

The non-crystal light transmitting conductive layer 3 has a thickness of for example, 10 nm or more, preferably 30 nm or more, more preferably 50 nm or more, and for example, 200 nm or less, preferably 150 nm or less, more preferably 100 nm or less.

The thickness of the non-crystal light transmitting conductive layer 3 can be measured by, for example, observation of cross sections using a transmission electron microscope.

4. Method for Producing Light Transmitting Conductive Film

Next, description is given below of a method for producing a light transmitting conductive film 1.

The light transmitting conductive film 1 is produced by preparing a light transmitting substrate 2, and forming a non-crystal light transmitting conductive layer 3 on the surface of the light transmitting substrate 2.

For example, the non-crystal light transmitting conductive layer 3 is disposed (laminated) on the upper face of the light transmitting substrate 2 by dry method.

Examples of the dry method include, vacuum deposition, sputtering, and ion plating. Preferably, sputtering is used.

In sputtering, a target and an adherend (light transmitting substrate 2) are placed to face each other in a chamber of a vacuum device, and gas is supplied while applying a voltage to accelerate gas ion to the target, ejecting the target material from the target surface to laminate the target material on the adherend surface.

Examples of the sputtering include bipolar sputtering, ECR (electronic cyclotron resonance) sputtering, magnetron sputtering, and ion beam sputtering. Preferably, magnetron sputtering is used.

The power source used for sputtering can be any of, for example, direct current (DC) power source, alternating current/middle frequency (AC/MF) power source, radio frequency (RF) power source, and radio frequency power source in which direct current power source is superimposed.

Examples of the target include the above-described metal oxides that form the non-crystal light transmitting conductive layer 3. For example, when ITO is used for the material of the non-crystal light transmitting conductive layer 3, a target composed of ITO is used. The tin oxide ($SnO_2$) content of the target relative to a total amount of tin oxide and indium oxide ($In_2O_3$) is, for example, 0.5 mass % or more, preferably 3 mass % or more, more preferably 8 mass % or more, and for example, 25 mass % or less, preferably 15 mass % or less, more preferably 13 mass % or less.

The horizontal magnetic field strength at the target surface is, in view of the film-forming speed and incorporation of impurity into the non-crystal light transmitting conductive layer 3, for example, 10 mT or more and 200 mT or less.

The discharge atmospheric pressure at the time of sputtering is, for example, 1.0 Pa or less, preferably 0.5 Pa or less, and for example, 0.01 Pa or more.

The temperature of the light transmitting substrate 2 at the time of sputtering is, in view of keeping non-crystallinity of the non-crystal light transmitting conductive layer 3, for example, 180° C. or less, preferably 90° C. or less. When the temperature of the light transmitting substrate 2 is more than the above-described range, the non-crystal light transmitting conductive layer 3 may not be obtained, and may be converted to crystalline simultaneously with sputtering.

Examples of the gas used in sputtering include inert gas such as Ar. In this method, reactive gas such as oxygen gas is used in combination. The ratio of the reactive gas flow rate to the inert gas flow rate (reactive gas flow rate (sccm)/inert gas flow rate (sccm)) is, for example, 0.1/100 or more and 5/100 or less.

In this method, by adjusting particularly the oxygen gas amount, the light transmitting conductive film 1 with characteristics described later can be produced.

That is, for example, when the ITO layer is formed as the non-crystal light transmitting conductive layer 3 by sputtering, the ITO layer produced by sputtering is generally formed as non-crystal ITO layer. At this time, the amount of oxygen introduced in the non-crystal ITO layer changes the film properties of the non-crystal ITO layer. To be specific, when the amount of oxygen introduced into the non-crystal ITO layer is less than the suitable amount (oxygen deficient state), heating under atmosphere causes conversion to crystalline, and as a result, the surface resistance value after heating greatly reduces. Meanwhile, when the amount of oxygen introduced to and contained in the non-crystal ITO layer is suitable, even with heating under atmosphere, the non-crystal structure is kept, and changes in resistance is small. Meanwhile, when the amount of oxygen introduced to and contained in the non-crystal ITO is more excessive than the suitable amount, the non-crystal structure is kept with heating under air atmosphere but the surface resistance value after heating increases greatly, causing large changes in resistance.

The reasons for the above can be assumed as follows. However, the present invention is not limited by the theory below. When the oxygen amount contained in the non-crystal ITO layer is small (oxygen deficient state), the non-crystal ITO layer has a large number of oxygen deficient portion in its structure, and the atoms forming the ITO skin easily move by thermal vibration, thus the most suitable structure is easily achieved. Therefore, with heating under air atmosphere, while incorporating oxygen into the oxygen deficient portion, the most suitable structure (crystalline structure) is achieved, and as a result, the surface resistance value is greatly reduced. Meanwhile, when the amount of oxygen introduced and contained in the non-crystal ITO is in the range of a suitable amount, oxygen deficient portion is hardly caused in the non-crystal ITO layer. That is, the range of a suitable amount of oxygen is the range that allows the non-crystal ITO to easily achieve stoichiometric amount. When the oxygen amount is suitable, even when the non-crystal ITO is heated under air atmosphere, oxygen deficient portion is small, and excessive oxidation is not caused, keeping excellent non-crystal structure. Meanwhile, when the amount of oxygen introduced to and contained in the non-crystal ITO is excessive, the oxygen atoms contained in the non-crystal ITO skin affect as impurities. The impurity atoms are causes of neutron scattering when it is more than the suitable level of content, and increases the surface resistance value. Therefore, when the amount of oxygen introduced to and contained in the non-crystal ITO is excessive, it is assumed that heating causes the oxygen amount in the ITO to be even more excessive, and surface resistance value is greatly increased.

To be specific, for example, the rate of oxygen gas supplied to the chamber is adjusted so that the oxygen amount contained in ITO is in a suitable range.

A suitable value of oxygen gas supply rate is suitably set in accordance with facility factors such as sputtering power source, magnetic field strength, and chamber volume of the vacuum device, and materials factors such as the amount of reactive gas (water, etc.) contained in a small amount in the light transmitting substrate 2. For example, of the polymer film containing reactive gas and the glass substrate containing no reactive gas, the polymer film is preferable because the amount of oxygen gas supply can be reduced. Furthermore, because the magnetic field strength and power source are related to the amount of $O_2$ plasma produced, the amount of oxygen gas supply changes depending on magnetic field strength and power source used. Also, in view of reducing the amount of heat applied to the light transmitting substrate 2 and increasing non-crystallinity, low magnetic field is preferable. In view of film-forming rate, a direct current power source is preferable.

To be specific, for example, when a polymer film is used as the light transmitting substrate 2 and the horizontal magnetic field strength is set to be a low magnetic field strength of 1 to 50 mT (preferably 20 to 40 mT), and a direct current power source is used, the ratio of oxygen gas relative to Ar gas ($O_2$/Ar) is, for example, 0.022 or more, preferably 0.025 or more, more preferably 0.028 or more, and for example, 0.036 or less, preferably 0.035 or less, more preferably 0.034 or less.

For example, when a polymer film is used as the light transmitting substrate 2, and the horizontal magnetic field strength is set to be a high magnetic field strength of 50 to 200 mT (preferably 80 to 120 mT), and the direct current power source is used, the ratio of oxygen gas relative to Ar gas ($O_2$/Ar) is, for example, 0.018 or more, preferably 0.020 or more, more preferably 0.022 or more, and for example, 0.035 or less, preferably 0.034 or less, more preferably 0.033 or less, even more preferably 0.025 or less.

Whether or not the suitable amount of oxygen is introduced into ITO can be determined, for example, with a graph in which the oxygen supply amount (sccm)(X axis) supplied in sputtering and the surface resistance value ($\Omega/\square$)(Y axis) of ITO produced by the oxygen supply amount are plotted. That is, the neighborhood region to the minimum in the graph is the minimum surface resistance value, and ITO has the stoichiometric composition, and therefore the value at X axis in the neighborhood region to the minimum can be determined as the suitable oxygen supply amount with which ITO has stoichiometric composition of oxygen.

In this manner, the light transmitting conductive film 1 (before heat treatment) including the light transmitting substrate 2 and the non-crystal light transmitting conductive layer 3 is produced.

The light transmitting conductive film 1 has a thickness in total of, for example, 2 μm or more, preferably 20 μm or more, and for example, 300 μm or less, preferably 200 μm or less.

The light transmitting conductive film 1 thus produced has the following characteristics.

The non-crystal light transmitting conductive layer 3 has, before heat treatment, a carrier density ($Xa \times 10^{19}/cm^3$) of, for example, $10.0 \times 10^{19}/cm^3$ or more, preferably $20.0 \times 10^{19}/cm^3$ or more, more preferably $29.0 \times 10^{19}/cm^3$ or more, and for example, $50.0 \times 10^{19}/cm^3$ or less, preferably $43.0 \times 10^{19} cm^3$ or less.

The non-crystal light transmitting conductive layer 3 has, before heat treatment, a hole mobility (Ya $cm^2/V \cdot s$) of, for example, 10.0 $cm^2/V \cdot s$ or more, preferably 15.0 $cm^2/V \cdot s$ or more, more preferably 28.0 $cm^2/V \cdot s$ or more, and for example, 50.0 $cm^2/V \cdot s$ or less, preferably 36.5 $cm^2/V \cdot s$ or less.

The non-crystal light transmitting conductive layer 3 has, before heat treatment, a surface resistance value of, for example, 1$\Omega/\square$ or more, preferably 10$\Omega/\square$ or more, and for example, 200$\Omega/\square$ or less, preferably 150$\Omega/\square$ or less, more preferably less than 100$\Omega/\square$.

Before heat treatment means, for example, after production of the light transmitting conductive film 1 before heating to 80° C. or more.

The heated light transmitting conductive layer, i.e., after the non-crystal light transmitting conductive layer 3 is heated, has a carrier density ($Xc \times 10^{19}/cm^3$) of, for example, $15.0 \times 10^{19}/cm^3$ or more, preferably $20.0 \times 10^{19}/cm^3$ or more, more preferably $30.0 \times 10^{19}/cm^3$ or more, and for example, $150.0 \times 10^{19}/cm^3$ or less, preferably $100.0 \times 10^{19}/cm^3$ or less, more preferably $80.0 \times 10^{19}/cm^3$ or less.

The heated light transmitting conductive layer has a hole mobility (Yc $cm^2/V \cdot s$) of, for example, 10.0 $cm^2/V's$ or more, preferably 15.0 $cm^2/V \cdot s$ or more, and for example, 35.0 cm²/V·s or less, preferably 30.0 cm²/V·s or less, more preferably 23.5 cm²/V·s or less, more preferably 22.5 cm²/V·s or less.

The heated light transmitting conductive layer has a surface resistance value of, for example, 1Ω/□ or more, preferably 10Ω/□ or more, and for example, 200Ω/□ or less, preferably 150Ω/□ or less, more preferably less than 100Ω/□.

The heated light transmitting conductive layer means the light transmitting conductive layer after the non-crystal light transmitting conductive layer 3 is heated in air. The temperature and exposure time in heating is, for example, at 80° C. for 500 hours, in view of ensuring long time reliability of the non-crystal light transmitting conductive layer 3. When heating is performed for accelerated test of long time reliability evaluation, for example, heating can be performed at 140° C. for 1 to 2 hours.

The carrier density of the non-crystal light transmitting conductive layer 3 ($Xa \times 10^{19}/cm^3$) and the carrier density of the heated light transmitting conductive layer ($Xc \times 10^{19}/cm^3$) satisfy formula (1) of $Xa \leq Xc$, preferably satisfies formula (1') of $Xa < Xc$. When $Xa > Xc$ is satisfied, the surface resistance value of the non-crystal light transmitting conductive layer 3 largely increases, and therefore stability at the time of heating is poor.

Particularly, the ratio of carrier density after heating to before heating is, that is, Xc to Xa (Xc/Xa) is, preferably more than 1.00, more preferably 1.05 or more, even more preferably 1.10 or more. Preferably, it is less than 2.00, more preferably 1.80 or less. The ratio in the above-described range allows for reliable suppression of changes in resistance by heating, and even more excellent thermal stability.

The hole mobility of the non-crystal light transmitting conductive layer 3 (Ya cm²/V·s) and the hole mobility of the heated light transmitting conductive layer (Ya cm²/V·s) satisfy formula (2) $Ya \geq Yc$, preferably satisfy formula (2') $Ya > Yc$. When $Ya < Yc$ is satisfied, the non-crystal light transmitting conductive layer 3 is crystallized by the heating, and the surface resistance value easily decreases largely, and as a result, stability at the time of heating is poor.

Particularly, the ratio of hole mobility after heating to before heating, that is, Yc relative to Ya (Yc/Ya) is preferably less than 1.00, more preferably 0.75 or less. Preferably, it is more than 0.50, more preferably 0.60 or more. The ratio in the above-described range allows for reliable suppression of changes in resistance by heating, and even more excellent thermal stability.

Figure 3:
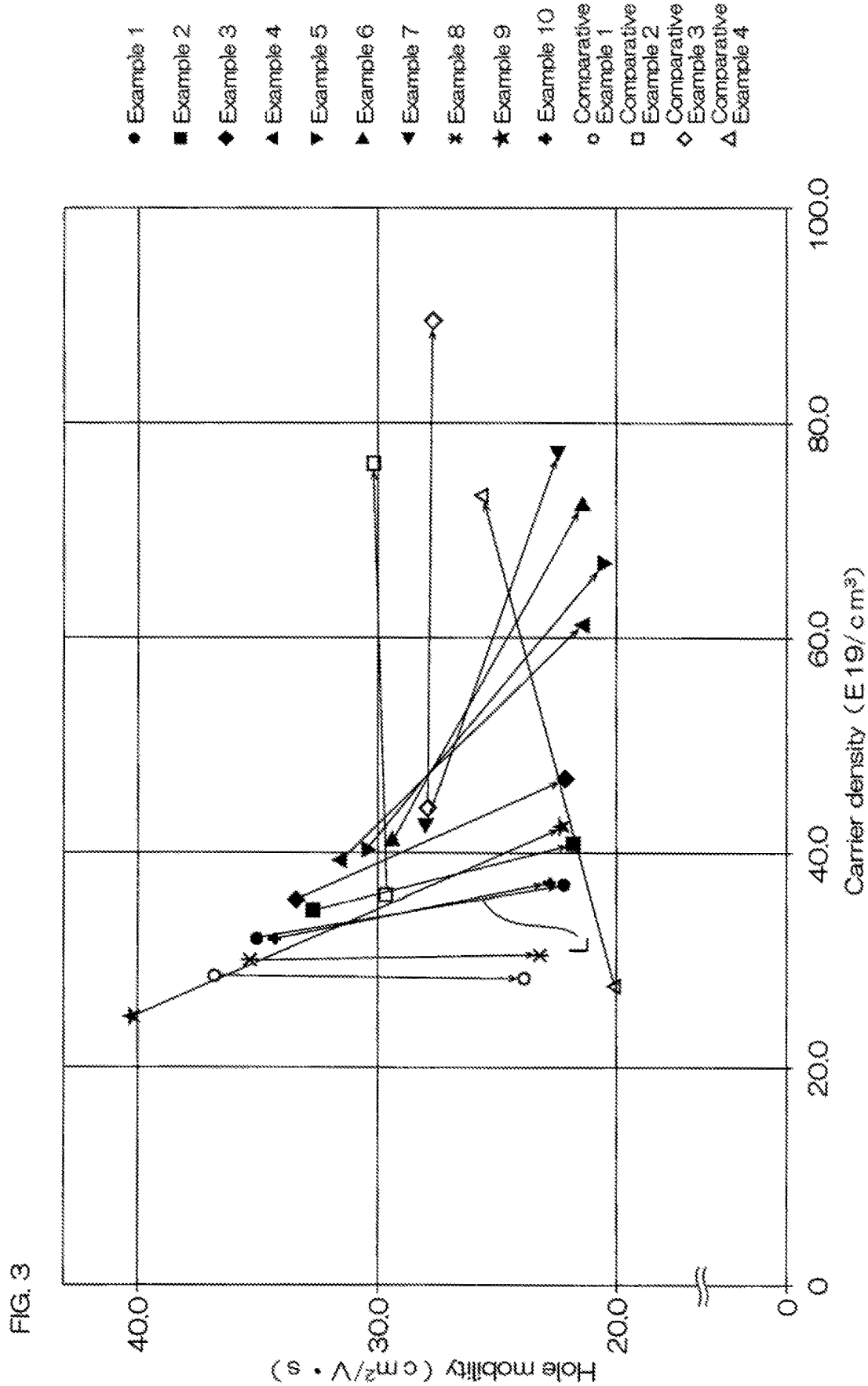
FIG. 3 shows a graph in which hole mobility and carrier density of the light transmitting conductive layer of the light transmitting conductive film in Examples and Comparative Examples are plotted.

When the moving distance L satisfies $\{(Xc-Xa)^2+(Yc-Ya)^2\}^{1/2}$ (ref: FIG. 3), L is 1.0 or more and 45.0 or less. It is preferably 10.0 or more, more preferably 13.0 or more, and preferably 40.0 or less, more preferably less than 35.0, more preferably 33.0 or less. Moving distance L of the above-described range allows for small changes in film quality of the non-crystal light transmitting conductive layer 3 before and after heating, and particularly thermal stability is excellent.

The product of the ratio of the carrier density before and after (Xc/Xa) and the ratio of the hole mobility before and after (Yc/Ya), that is, (Yc/Ya)×(Xc/Xa) is, for example, 0.50 or more, preferably 0.65 or more, more preferably 0.75 or more, and for example, 1.80 or less, preferably 1.50 or less, more preferably 1.30 or less. The ratio of carrier density and the ratio of hole mobility before and after heating within the above range allow for suppression of crystallinity and suppression of resistance changes.

The heated light transmitting conductive layer is preferably non-crystal. In this fashion, excellent thermal stability, anti-cracking properties, and abrasion resistance are achieved.

The light transmitting conductive film 1 includes the light transmitting substrate 2 and the non-crystal light transmitting conductive layer 3, and therefore excellent anti-cracking properties and abrasion resistance can be achieved.

The hole mobility and carrier density of the non-crystal light transmitting conductive layer 3 before heating and the heated light transmitting conductive layer satisfy predetermined conditions, and therefore changes in resistivity of the non-crystal light transmitting conductive layer 3 by heating can be suppressed, and excellent thermal stability can be achieved.

Particularly, the present inventors have found that because the specific resistance of the non-crystal light transmitting conductive layer 3 is inversely proportional to the product of the hole mobility and the carrier density, in order to minimize the changes in resistance by heating, the film quality of the non-crystal light transmitting conductive layer 3 has to be designed so that hole mobility behavior and carrier density behavior are opposite before and after heating, thus achieving the present invention. That is, the non-crystal light transmitting conductive layer 3 of the present invention satisfies formulas (1) to (3), i.e., in the film is designed so that in the non-crystal light transmitting conductive layer 3, the hole mobility after heating is set low, and the carrier density after heating is set large, and moving distance L is set small, to suppress changes in the specific resistance value before and after heating. As a result, changes in resistance by heating are small, and excellent thermal stability is achieved.

The light transmitting conductive film 1 is an industrially applicable device.

Etching can be performed as necessary to the light transmitting conductive film 1 to pattern the non-crystal light transmitting conductive layer 3 into a predetermined pattern.

The production method described above can be performed by roll-to-roll method, or batch method.

5. Method for Producing Light Control Film

Next, description is given below of a method for producing a light control film 4 using the light transmitting conductive film 1 described above with reference to FIG. 2.

In this method, as shown in FIG. 2, a step of producing two light transmitting conductive films 1 described above, and then a step of sandwiching a light control function layer 5 by the two light transmitting conductive films 1 are included.

First, two light transmitting conductive films 1 described above are produced. One light transmitting conductive film 1 can be cut to form two light transmitting conductive films 1.

The two light transmitting conductive films 1 are a first light transmitting conductive film 1A and a second light transmitting conductive film 1B.

Then, the light control function layer 5 is formed on the upper face (surface) of the non-crystal light transmitting conductive layer 3 of the first light transmitting conductive film 1A by, for example, wet method.

For example, a solution containing a liquid crystal composition is applied on the upper face of the non-crystal light transmitting conductive layer 3 in the first light transmitting conductive film 1A. For the liquid crystal composition, a known one contained in solution can be used, and for example, a liquid crystal dispersion resin described in Japanese Unexamined Publication H8-194209 can be used.

Then, the second light transmitting conductive film 1B is laminated on the surface of the costing so that the non-crystal light transmitting conductive layer 3 of the second light transmitting conductive film 1B is in contact with the coating. In this manner, the coating is sandwiched by two light transmitting conductive films 1, that is, the first light transmitting conductive film 1A and the second light transmitting conductive film 1B.

Thereafter, a suitable treatment is given to the coating (for example, photo curing treatment and heat drying, etc.), to form the light control function layer 5. The light control function layer 5 is formed between the non-crystal light transmitting conductive layer 3 of the first light transmitting conductive film 1A and the non-crystal light transmitting conductive layer 3 of the second light transmitting conductive film 1B.

The light control film 4 including the first light transmitting conductive film 1A, the light control function layer 5, and the second light transmitting conductive film 1B in sequence is produced in this manner.

Then, the light control film 4 is included in a light control device (not shown, for example, light control window, etc.) including a power source (not shown), and a control device (not shown). In the light control device, which is not shown, a power source applies voltage to the non-crystal light transmitting conductive layer 3 in the first light transmitting conductive film 1A and the non-crystal light transmitting conductive layer 3 in the second light transmitting conductive film 1B, and this generates electric field therebetween.

Then, the electric field is controlled by the control device so that the light control function layer 5 positioned between the first light transmitting conductive film 1A and the second light transmitting conductive film 1B blocks or passes light.

The light control film 4 includes the light transmitting conductive film 1, and therefore has excellent workability and transportability. Inconsistent surface resistance and inhomogeneous orientation of the light control function layer 5 can be suppressed for a long time, and therefore inconsistent light control can be decreased.

6. Modified Example

In the embodiment of FIG. 1, the non-crystal light transmitting conductive layer 3 is directly disposed on the surface of the light transmitting substrate 2, but for example, although not shown, a function layer can be provided on the upper face and/or lower face of the light transmitting substrate 2.

That is, for example, the light transmitting conductive film 1 includes the light transmitting substrate 2, the function layer disposed on the upper face of the light transmitting substrate 2, and the non-crystal light transmitting conductive layer 3 disposed on the upper face of the function layer. The light transmitting conductive film 1 can include the light transmitting substrate 2, the non-crystal light transmitting conductive layer 3 disposed on the upper face of the light transmitting substrate 2, and the function layer disposed on the lower face of the light transmitting substrate 2. The function layer and the non-crystal light transmitting conductive layer 3 can be disposed on the upper side and the lower side of the light transmitting substrate 2 in this sequence.

Examples of the function layer include an adhesion easy layer, under coat layer, and hard coat layer. The adhesion easy layer is a layer provided to improve adherence between the light transmitting substrate 2 and the non-crystal light transmitting conductive layer 3. The under coat layer is a layer provided to adjust reflectivity and optical color of the light transmitting conductive film 1. The hard coat layer is a layer provided to improve abrasion resistance of the light transmitting conductive film 1. These function layers can be used singly, or can be used in combination.

EXAMPLE

While in the following, the present invention is described with reference to Examples, the present invention is not limited to any of them by no means, and modification and changes can be made based on the technical ideas of the present inventors within the range not deviating from the gist of the present invention. The specific numerical values in blending ratio (content), physical property values, and parameters used in the following description can be replaced with upper limit values (numerical values defined with "or less" or "below") or lower limit values (numerical values defined with "or more" or "above") of corresponding numerical values in blending ratio (content), physical property value, and parameter described in the above-described "DESCRIPTION OF EMBODIMENTS".

Example 1

A polyethylene terephthalate (PET) film (manufactured by Mitsubishi Plastics, Inc., product name "DIAFOIL") having a thickness of 188 μm was prepared, and this was named a light transmitting substrate.

The PET film was set in a roll-to-roll sputtering device, and evacuation was performed. Thereafter, Ar and $O_2$ were introduced to achieve a vacuum atmosphere with an atmospheric pressure of 0.4 Pa, and a light transmitting conductive layer having a thickness of 65 nm and composed of ITO was made by DC magnetron sputtering. The ITO was non-crystal.

For the target, a sintered product with 10 mass % tin oxide and 90 mass % indium oxide was used, and the horizontal magnetic field of the magnet was set to 30 mT. The ratio of $O_2$ flow rate relative to Ar flow rate ($O_2$/Ar) was adjusted to be 0.0342.

Example 2

A light transmitting conductive film (ITO thickness: 65 nm) was produced in the same manner as in Example 1, except that the ratio of $O_2$ flow rate relative to Ar flow rate ($O_2$/Ar) was changed to 0.0333.

Example 3

A light transmitting conductive film (ITO thickness: 65 nm) was produced in the same manner as in Example 1, except that the ratio of $O_2$ flow rate relative to Ar flow rate ($O_2$/Ar) was changed to 0.0327.

Example 4

A light transmitting conductive film (ITO thickness: 65 nm) was produced in the same manner as in Example 1, except that the ratio of $O_2$ flow rate relative to Ar flow rate ($O_2$/Ar) was changed to 0.0296.

Example 5

A light transmitting conductive film (ITO thickness: 65 nm) was produced in the same manner as in Example 1, except that the ratio of $O_2$ flow rate relative to Ar flow rate ($O_2$/Ar) was changed to 0.0289.

Example 6

A light transmitting conductive film (ITO thickness: 65 nm) was produced in the same manner as in Example 1, except that the ratio of $O_2$ flow rate relative to Ar flow rate ($O_2$/Ar) was changed to 0.0280.

Example 7

A light transmitting conductive film (ITO thickness: 65 nm) was produced in the same manner as in Example 1, except that ratio of $O_2$ flow rate relative to Ar flow rate ($O_2$/Ar) was changed to 0.0264.

Example 8

A light transmitting conductive film (ITO thickness: 65 nm) was produced in the same manner as in Example 1, except that the ratio of $O_2$ flow rate relative to Ar flow rate ($O_2$/Ar) was changed to 0.0358.

Example 9

A polyethylene terephthalate (PET) film (manufactured by Mitsubishi Plastics, Inc., product name "DIAFOIL") having a thickness of 50 μm was used as a light transmitting substrate.

A light transmitting conductive film was produced in the same manner as in Example 1, except that an ITO layer having a thickness of 30 nm was formed on the light transmitting substrate, setting the horizontal magnetic field of magnet to 100 mT, the film-forming atmospheric pressure to 0.3 Pa, and the ratio of $O_2$ flow rate relative to Ar flow rate ($O_2$/Ar) to 0.0223.

Example 10

A light transmitting conductive film (ITO thickness: 65 nm) was produced in the same manner as in Example 1, except that the ratio of $O_2$ flow rate relative to Ar flow rate ($O_2$/Ar) was changed to 0.0338.

Comparative Example 1

A light transmitting conductive film (ITO thickness: 65 nm) was produced in the same manner as in Example 1, except that the ratio of $O_2$ flow rate relative to Ar flow rate ($O_2$/Ar) was changed to 0.0373.

Comparative Example 2

A light transmitting conductive film (ITO thickness: 30 nm) was produced in the same manner as in Example 9, except that the atmospheric pressure was set to 0.4 Pa, and the ratio of $O_2$ flow rate relative to Ar flow rate ($O_2$/Ar) was changed to 0.0114.

Comparative Example 3

A light transmitting conductive film (ITO thickness: 30 nm) was produced in the same manner as in Example 9, except that the atmospheric pressure was set to 0.4 Pa, the ratio of $O_2$ flow rate relative to Ar flow rate ($O_2$/Ar) was changed to 0.0074, and a RF superimposed DC magnetron sputtering (RF frequency 13.56 MHz, ratio of RF electric power to DC electric power (RF electric power/DC electric power) was 0.2) was performed.

Comparative Example 4

A light transmitting conductive film was produced in the same manner as in Example 1, except that a PET film having a thickness of 50 μm was used, the ratio of $O_2$ flow rate relative to Ar flow rate ($O_2$/Ar) was changed to 0.0201, and the thickness of the ITO layer was changed to 30 nm.

The following measurements were conducted for the light-transparent conductive film produced in Examples and Comparative Examples. The results are shown in Table 1 and FIG. 3.

As is clear from FIG. 3, with the light-transparent conductive film of Examples, "after-heating" is plotted toward the lower right direction relative to the "before heating", and the distance L between the "before-heating" and "after-heating" plotted was short. Meanwhile, with the light-transparent conductive film of Comparative Example 1, "after-heating" is plotted toward the lower left direction relative to the "before-heating". With the light-transparent conductive film of the Comparative Examples 2 and 4, "after-heating" is plotted toward the upper right direction relative to the "before-heating". With the light-transparent conductive film of Comparative Examples 3 and 4, the distance L between the "before-heating" and "after-heating" was long.

TABLE 1

| | ITO layer before heating | | | | Heated ITO layer | | | Ratio of heated/before heating | | | | |
| --- | --- | --- | --- | --- | --- | --- | --- | --- | --- | --- | --- | --- |
| | Hole mobility Ya (cm²/V·s) | Carrier density Xa (×10¹⁹/cm³) | Crystal-linity | Ar content (atomic %) | Hole mobility Yc (cm²/V·s) | Carrier density Xc (×10¹⁹/cm³) | Crystal-linity | Hole mobility Yc/Ya | Carrier density Xc/Xa | (Yc/Ya) × (Xc/Xn) | Moving distance L | Rate of change of Resistance |
| Example 1 | 35.1 | 32.2 | Non-crystal | 0.3 | 22.2 | 37.2 | Non-crystal | 0.63 | 1.15 | 0.73 | 13.8 | Fair |
| Example 2 | 32.7 | 34.8 | Non-crystal | 0.3 | 21.8 | 40.9 | Non-crystal | 0.67 | 1.18 | 0.79 | 12.3 | Good |
| Example 3 | 33.4 | 35.8 | Non-crystal | 0.3 | 22.1 | 46.9 | Non-crystal | 0.66 | 1.31 | 0.86 | 15.9 | Good |
| Example 4 | 31.6 | 39.4 | Non-crystal | 0.3 | 21.4 | 61.2 | Non-crystal | 0.68 | 1.55 | 1.05 | 24.1 | Good |
| Example 5 | 30.5 | 40.3 | Non-crystal | 0.3 | 20.5 | 66.9 | Non-crystal | 0.67 | 1.66 | 1.11 | 28.5 | Good |
| Example 6 | 29.4 | 41.2 | Non-crystal | 0.3 | 21.4 | 72.5 | Non-crystal | 0.73 | 1.76 | 1.28 | 32.3 | Good |
| Example 7 | 28.0 | 42.7 | Non-crystal | 0.3 | 22.4 | 77.4 | Non-crystal | 0.80 | 1.81 | 1.45 | 35.1 | Fair |
| Example 8 | 35.3 | 30.2 | Non-crystal | 0.3 | 23.2 | 30.6 | Non-crystal | 0.66 | 1.01 | 0.67 | 12.1 | Fair |
| Example 9 | 40.4 | 24.9 | Non-crystal | 0.2 | 24.9 | 42.4 | Non-crystal | 0.62 | 1.70 | 1.05 | 23.4 | Good |
| Example 10 | 34.3 | 32.1 | Non-crystal | 0.3 | 22.8 | 37.3 | Non-crystal | 0.66 | 1.16 | 0.77 | 12.6 | Good |

TABLE 1-continued

|  | ITO layer before heating | | | | Heated ITO layer | | | Ratio of heated/before heating | | | | |
| --- | --- | --- | --- | --- | --- | --- | --- | --- | --- | --- | --- | --- |
|  | Hole mobility Ya (cm²/ V·s) | Carrier density Xa (×10¹⁹/ cm³) | Crystal-linity | Ar content (atomic %) | Hole mobility Yc (cm²/ V·s) | Carrier density Xc (×10¹⁹/ cm³) | Crystal-linity | Hole mobility Yc/ Ya | Carrier density Xc/ Xa | (Yc/ Ya) × Xc/ Xn) | Moving distance L | Rate of change of Resistance |
| Comparative Example 1 | 36.7 | 28.8 | Non-crystal | 0.3 | 23.9 | 28.4 | Non-crystal | 0.65 | 0.99 | 0.64 | 12.9 | Bad |
| Comparative Example 2 | 29.6 | 36.2 | Non-crystal | 0.1 | 30.2 | 76.7 | Crystal | 1.02 | 2.12 | 2.16 | 40.5 | Bad |
| Comparative Example 3 | 27.9 | 44.3 | Non-crystal | 0.1 | 27.7 | 89.5 | Crystal | 0.99 | 2.02 | 2.00 | 45.2 | Bad |
| Comparative Example 4 | 20.1 | 28.7 | Non-crystal | 0.2 | 26.2 | 73.4 | Crystal | 1.30 | 2.56 | 3.33 | 45.1 | Bad |

(Evaluation)

(1) Thickness

The thickness of the PET film (transparent substrate) was measured using a coating thickness meter (manufactured by OZAKI MFG. CO., LTD., device name, "digital dial gage, DG-205"). The thickness of the ITO layer (light transmitting conductive layer) was measured by observation of cross section using a transmission electron microscope (manufactured by Hitachi, Ltd., device name, "HF-2000").

(2) Ar Content

The amount of Ar atoms present in the ITO layer of the light transmitting conductive film was analyzed using a measurement device (manufactured by National Electrostatics Corporation, "Pelletron 3SDH") based on measurement principle of Rutherford backscattering spectrometry. To be specific, four elements of In, Sn, O, and Ar are detected, and ratio of the amount of Ar atoms present relative to the amount of atoms of the four elements (atomic %) was measured.

(3) Carrier Density and Hole Mobility of Non-Crystal Light Transmitting Conductive Layer Measurement was performed using a Hall effect measurement system (manufactured by Bio-Rad Laboratories. Inc., trade name, "HL5500PC"). The carrier density was calculated using the thickness of the ITO layer using (1) above.

(4) Carrier Density and Hole Mobility of Heated Light Transmitting Conductive Layer The light transmitting conductive film was heated at 80° C. for 500 hours, thereby producing a heated light transmitting conductive film including the PET film (transparent substrate) and the heated ITO layer (heated light transmitting conductive layer).

The carrier density and the hole mobility of the heated ITO layer were measured in the same manner as in (3) above using the Hall effect measurement system (manufactured by Bio-Rad Laboratories, Inc., trade name. "HL5500PC").

(5) Calculation on Moving Distance

The moving distance L was calculated using the carrier density and the hole mobility obtained in (4) and (5) above based on the formula below.

$$L=\{(Xc-Xa)^2+(Yc-Ya)^2\}^{1/2}$$

The carrier density of the non-crystal light transmitting conductive layer was $Xa \times 10^{19}(/cm^3)$, and the hole mobility of the non-crystal light transmitting conductive layer was Ya $(cm^2/V \cdot s)$. The carrier density of the heated light transmitting conductive layer was $Xc \times 10^{19}(/cm^3)$, and the hole mobility of the heated light transmitting conductive layer was Yc $(cm^2/V \cdot s)$.

(6) Crystallinity of Light Transmitting Conductive Layer and Heated Light Transmitting Conductive Layer The light transmitting conductive film and the heated light transmitting conductive film were immersed in hydrochloric acid (concentration: 5 mass %) for 15 minutes, and then thereafter washed with water and dried. The resistance between the two terminals of about 15 mm of the conductive layers was measured. When the resistance between the two terminals of 15 mm was more than 10 kΩ, it was determined to be non-crystal, and when it was not more than 10 kΩ, it was determined to be crystalline.

(7) Evaluation on Rate of Change in Resistance

The surface resistance value of the ITO layer of the light transmitting conductive film was determined by four-point probe array in accordance with JIS K7194 (1994). That is, first, the surface resistance value (Ra) of ITO layer of the light transmitting conductive film was measured. Then, the surface resistance value (Rc) of the light transmitting conductive layer of the light transmitting conductive film after heating at 80° C. for 500 hours was measured. The rate of change in resistance of "after heating" relative to "before heating" of the surface resistance value (100×(Rc/Ra)) was determined, and evaluation was made based on the following criteria.

GOOD: changes in resistance was less than ±30%
FAIR: changes in resistance was ±(30% to 49%)
BAD: changes in resistance was ±50% or more While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICABILITY

The light transmitting conductive film and the light control film of the present invention can be applied to various industrial products, for example, light control element applications for window glasses for buildings and vehicles, partition walls, and interior products.

DESCRIPTION OF REFERENCE NUMERALS 1 light transmitting conductive film
2 light transmitting substrate
3 non-crystal light transmitting conductive layer

The invention claimed is:

1. A light transmitting conductive film comprising:
a light transmitting substrate, and
a non-crystal light transmitting conductive layer,
wherein the non-crystal light transmitting conductive layer has a carrier density of $Xa \times 10^{19}(/cm^3)$ and a hole mobility of $Ya$ $(cm^2/V \cdot s)$;
wherein a heated light transmitting conductive layer has a carrier density of $Xc \times 10^{19}(/cm^3)$ and a hole mobility of $Yc$ $(cm^2/V \cdot s)$, wherein the heated light transmitting conductive layer is the non-crystal light transmitting conductive layer after going through heating;
wherein a moving distance L is $\{(Xc-Xa)^2+(Yc-Ya)^2\}^{1/2}$, wherein the following conditions are satisfied:
(1) $Xa \leq Xc$,
(2) $Ya \geq Yc$, and
(3) the moving distance L is 1.0 or more and 45.0 or less,
wherein the heated light transmitting conductive layer is non-crystal, and
wherein the carrier density of the heated light transmitting conductive layer is $15.0 \times 10^{19}/cm^3$ or more.

2. The light transmitting conductive film according to claim 1, wherein
the ratio of Xc to Xa (Xc/Xa) is 1.05 or more and 1.80 or less.

3. The light transmitting conductive film according to claim 1, wherein the non-crystal light transmitting conductive layer contains indium-based conductive oxide.

4. A light control film comprising a first light transmitting conductive film, a light control function layer, and a second light transmitting conductive film in sequence,
wherein the first light transmitting conductive film and/or the second light transmitting conductive film include the light transmitting conductive film according to claim 1.

* * * * *